United States Patent [19]

Buttle

[11] Patent Number: 4,721,957
[45] Date of Patent: Jan. 26, 1988

[54] GROUND SHIFT COMPENSATED PARAMETER MEASUREMENT SYSTEM

[75] Inventor: Donald R. Buttle, Bolingbrook, Ill.

[73] Assignee: TRW Inc., Cleveland, Ohio

[21] Appl. No.: 617,689

[22] Filed: Jun. 6, 1984

[51] Int. Cl.$^4$ .............................................. G01R 19/00
[52] U.S. Cl. .............................. 340/870.39; 324/76 R
[58] Field of Search ...................... 324/76 R, 130, 157; 307/10 R, 51; 323/234, 236, 909; 340/870.39

[56] References Cited

U.S. PATENT DOCUMENTS

| | | | |
|---|---|---|---|
| 3,681,753 | 8/1972 | Whalen et al. | 340/59 |
| 3,970,930 | 7/1976 | Vermolen | 324/98 |
| 4,020,416 | 4/1977 | Ottos | 324/64 |
| 4,376,298 | 3/1983 | Sokol et al. | 364/551 |
| 4,385,290 | 5/1983 | Fiala | 340/620 |
| 4,398,188 | 8/1983 | Feigal et al. | 340/650 |
| 4,414,852 | 11/1983 | McNeill | 73/765 |
| 4,532,510 | 7/1985 | Bertrand et al. | 323/909 X |
| 4,633,217 | 12/1986 | Akano | 340/870.39 X |

*Primary Examiner*—Jerry W. Myracle
*Attorney, Agent, or Firm*—Tarolli, Sundheim & Covell

[57] ABSTRACT

A parameter sensor system includes a sensor, one terminal of which is grounded on a metal chassis or the like. The ground potential of the metal chassis at the point of connection may shift above or below true ground potential due to the operation of other, high current devices also attached to the chassis. A switchable current source is connected to the second terminal of the sensor, and is turned on and off. A measuring circuit is also connected to the second terminal, and provides an output signal representative of the difference between the voltage on the second terminal when the current source is on and when it is off. The output signal varies as a direct function of sensor resistance, and is unaffected by shifts in ground voltage at the sensor.

10 Claims, 4 Drawing Figures

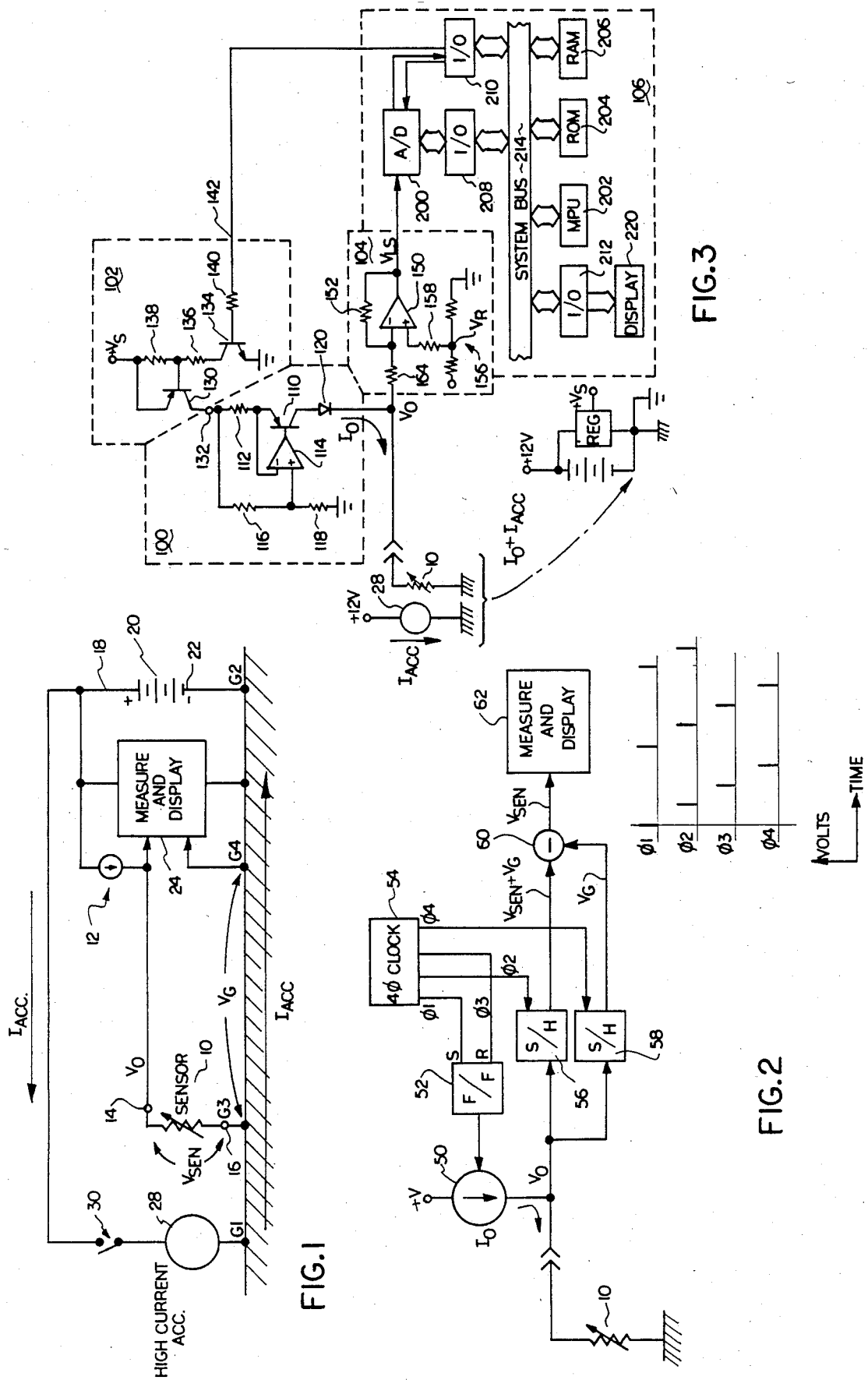

GROUND SHIFT COMPENSATED PARAMETER MEASUREMENT SYSTEM

BACKGROUND AND FIELD OF THE INVENTION

The present invention relates to the art of parameter measurement, and more particularly to a method and apparatus for correcting a parameter measurement for stray ground voltages in the equipment to which the measurement apparatus is attached.

Physical parameters such as position, temperature, pressure, liquid level, etc. are conventionally measured by systems including two principal elements—a parameter sensor or transducer for converting the physical parameter into an electrical parameter (such as resistance, capacitance, or inductance), and an electrical circuit for measuring the electrical parameter. Most often, it is the electrical resistance of the sensor which varies with the parameter being measured. In automotive and agricultural equipment, for example, fuel level senders, oil pressure sensors, water temperature sensors, etc. all are generally variable resistance elements whose resistance changes in direct relation to the parameter being measured. The resistance of the sensor element is determined by applying a known current through the sensor, and then measuring the resulting voltage drop across the sensor. As long as the applied current is maintained constant, the voltage drop across the sensor is directly proportional to the resistance of the sensor element.

The sensor must be mounted at the place on the equipment at which the parameter is to be measured. Often the sensor must be mounted an appreciable distance from the circuitry which actually generates the sensor current and measures the resulting sensor voltage. Although separate leads could be connected between each end of the sensor and a corresponding terminal of the measurement circuitry, in automotive applications it is not uncommon instead to connect one terminal of the sensor directly to the metal structure of the vehicle. The metal structure is usually grounded, and hence provides a ground return path for current between the sensor and the measurement circuitry. Thus, only one additional lead must be provided, connected between the other terminal on the sensor and the measurement circuitry.

When one end of the sensor is directly connected to a metal structure, it is implicitly assumed that the ground potential at that point on the structure is the same as the ground potential at the point on the structure to which the measurement circuitry is attached. This may not always be the case, however. There may be high circulating currents in the metal structure due to other, high current draw devices which also use the structure as a ground return path. The existence of the high circulating currents introduces measurable voltage drops between various points on the structure. Consequently, it is possible that the "ground" voltage at the point of connection of the sensor element to the structure may be shifted above or below ground voltage at the point of connection of the measurement circuitry to the structure. The voltage measured by the measurement circuitry represents the additive sum of the voltage across the sensor and the ground shift voltage. The parameter reading generated by the measurement circuitry will therefore be incorrect by an amount related to the magnitude of the ground shift potential.

SUMMARY OF THE INVENTION

In accordance with the present invention, the ground shift potential is measured by turning off the current source and then measuring the voltage on the sensor. Since no current then flows through the sensor, the voltage drop across the sensor element, per se, will be zero and the measured sensor output voltage will represent the ground shift voltage, exclusively. The current source is then turned on, and the resulting sensor voltage measured. The true voltage across the sensor is calculated by subtracting the first voltage measured (i.e. the ground shift voltage) from the second voltage measured (i.e. the sum of the actual sensor voltage and the ground shift voltage).

BRIEF DESCRIPTION OF THE DRAWINGS

The foregoing, and other features and advantages of the present invention, will become more readily apparent from the following detailed description, as taken in conjunction with the accompanying drawings, wherein:

FIG. 1 is a schematic illustration of a conventional parameter sensor system;

FIG. 2 is a block diagram of one embodiment of a parameter sensor system in accordance with the teachings of the present invention;

FIG. 3 is a detailed circuit schematic of the second, and presently preferred, embodiment of a parameter sensor system in accordance with the teachings of the present invention.

DETAILED DESCRIPTION

Figure 4:
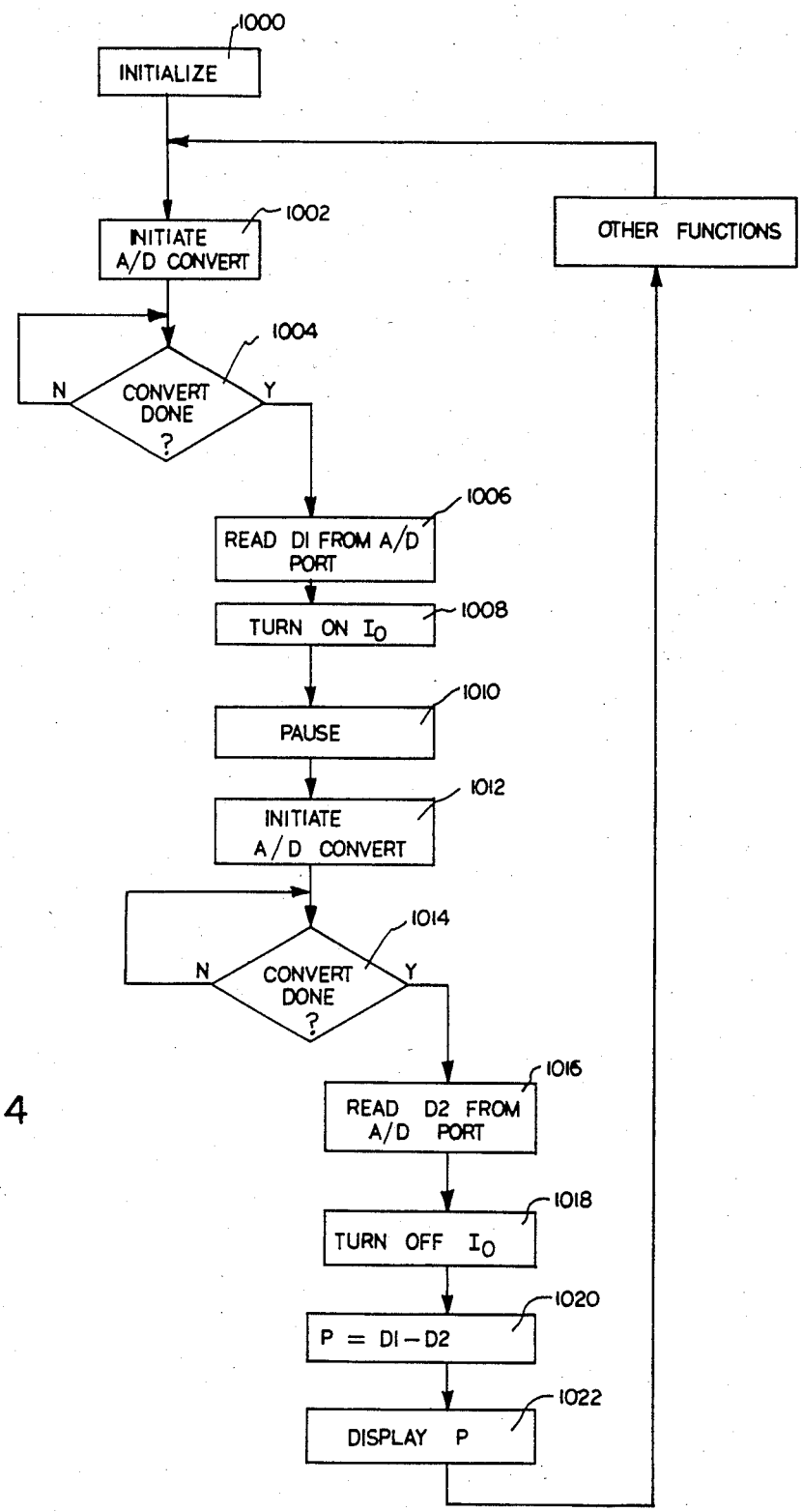
FIG. 4 is a flow chart illustrating the operations performed by the microprocessor associated with the FIG. 3 embodiment.

In the following detailed description, the invention is embodied in a system for measuring parameters associated with a vehicle, such as a truck, passenger car, agricultural tractor or combine, etc. The invention is not limited to such applications, however, and can be used advantageously in any system in which the sensor shares a common ground return line with other electrical devices.

FIG. 1 is a block diagram of a parameter measurement system such as may be found, for example, in an automotive or off-road vehicle application. In the FIG. 1 system, the sensor 10 is a two terminal device having a resistance which is directly proportional to the value of the parameter being sensed.

A current source 12 forces a constant-amplitude current through the sensor 10. The output of the current source 12 is applied to one terminal 14 of the sensor 10. The other terminal 16 of the sensor is connected to the metal structure of the vehicle, which is treated as "ground". Constant current source 12 causes a constant current to circulate through the loop which begins at the positive terminal 18 of the vehicle battery 20. The current loop includes the current source 12, the sensor 10, and a ground return path including the conductive structural elements between the terminal 16 of sensor 10 and the negative terminal 22 of battery 20.

The junction between the sensor 10 and the constant current source 12 is connected to a measurement and display circuit 24. The measurement and display circuit 24 exhibits a substantially greater input impedance than the sensor 10, however. Hence virtually all of the current from the current source 12 passes through the sensor 10. The voltage drop across the sensor 10 is thus equal to the resistance of the sensor times the magnitude of the constant current supplied by the current source. The current is constant, hence the voltage drop will vary in direct proportion to the resistance of the sensor and thus the value of the parameter being measured. The measurement and display circuit 24 measures the voltage $V_o$ appearing at the terminal 14 of the sensor, and provides a display of its value. The measurement and display circuit 24 has gain and offset values selected such that the units of display correspond to the units (i.e., lbs., °F., gal., etc.) of the parameter being measured.

In the FIG. 1 system, the ground return path used by the sensor includes structural elements of the vehicle to which the parameter sensor is attached. The current induced in the current loop by the current source 12 will generally not produce an appreciable voltage drop across the ground return path, since the sensing current is small (less than 50 milliamps) and the electrical resistance along the path is very low. Unfortunately, often other electrically powered devices (such as a high current accessory 28 of FIG. 1) also use the structure of the vehicle as a ground return current path. Certain accessories, such as electric lamps, motors, etc., draw as much as 30 to 100 amps of current from the battery 20, and thus provide substantial circulating currents through the structural elements of the vehicle. Because of the high magnitude of the current flow, even very small resistances in the structural elements will give rise to appreciable voltage drops across them. If, for example, the high current accessory 28 draws 30 amps and there is one-tenth of an ohm of resistance between its ground connection point G1 and a ground connection point G2 of the battery, then a voltage drop of three volts will appear across the ground connection points G1 and G2.

The sensor output voltage $V_o$ measured by the measurement and display circuit 24 is the sum of the voltage ($V_{SEN}$) across the sensor 10 and the voltage ($V_G$) between the ground connection point G3 of the sensor 10 and the ground connection point G4 of the input of the measurement and display circuit 24. If the current path between ground connection points G3 and G4 overlaps the current path between ground connection points G1 and G2 to any extent, a portion of the voltage drop across the ground connection points G1 and G2 will appear across the ground connection points G3 and G4. Consequently, the voltage sensor output $V_o$ will not be equal to the voltage drop across the sensor 10, and the value displayed by the measurement and display circuit 24 will be incorrect.

If the magnitude of the current drawn by the high current accessory 28 were constant, then the measurement and display circuit 24 could be adjusted to correct for the offset introduced by the ground circulating current. Often, however, the current drawn by the accessory varies. The accessory may, for example, be high intensity lamps which are required for night operation of the vehicle, but not daylight operation. Consequently, the lamps would be turned off during the daytime and turned on at night. It would be desireable if the measurement and display circuit 24 were capable of measuring the actual ground offset, and then compensating the sensor measurement appropriately.

The present invention accomplishes the measurement and correction of the offset introduced by ground circulating currents through a process which involves controlling the state of the current source which feeds current to the sensor. When the current source is turned off, the voltage $V_{SEN}$ across the sensor 10 will be zero, and the voltage $V_o$ will thus be equal to the ground offset voltage $V_G$ between the ground connection points G3 and G4. The voltage $V_G$ thus measured is stored and later used to correct the measurement obtained while the current source is turned on.

FIG. 2 is a block diagram of the system incorporating a switchable current source and elements for measuring and correcting for the voltage drop introduced by the ground circulating currents. In the FIG. 2 apparatus, the sensor 10 is connected to a switchable current source 50. The current source 50 is either on or off, depending upon the logic state of a control signal provided by a flip-flop 52. Flip-flop 52 is a set/reset flip-flop whose set and reset inputs are connected to different outputs of a four phase clock circuit 54.

Four phase clock 54 provides four output pulse trains, all having the same frequency but different phases. The phases of the pulse trains are offset from one another such that pulses occur on the four output lines in sequence. Thus, a pulse first appears on output $\phi 1$, and then output $\phi 2$, then output $\phi 3$, and finally output $\phi 4$. The $\phi 1$ output of the clock 54 is connected to the "set" input of flip-flop 52, and therefore the output of flip-flop 52 is forced to a high logic level when an $\phi 1$ clock pulse appears. The $\phi 3$ output of the clock 54, on the other hand, is connected to the "reset" input of flip-flop 52. Consequently, the output of flip-flop 52 is forced to a low logic level when a pulse appears on the $\phi 3$ output of clock 54. Since pulses alternately appear at the outputs $\phi 1$ and $\phi 3$ of the clock 54, the flip-flop 52 is cyclically set and reset, causing the current source 50 to be cyclically turned on and off.

The remaining two outputs of the four phase clock 54 are connected to the control input lines of corresponding sample and hold circuits 56 and 58. Each of the sample and hold circuits samples the input signal $V_o$ when a pulse appears on its corresponding control input line. Sample and hold circuit 56 is connected to the $\phi 2$ output of clock 54, hence it samples the sensor output signal $V_o$ during the time that the current source 50 is turned on. The control input line of the sample and hold circuit 58, on the other hand, is connected to the $\phi 4$ output of clock 54. Consequently, sample and hold circuit 58 samples the sensor output signal $V_o$ during the time that the current source 50 is turned off.

Each sample and hold circuit holds the sampled value during the interim between pulses. The output of sample and hold circuit 56 will therefore continually correspond to the $V_o$ obtained while the current source is turned on (i.e., to $V_{SEN}+V_G$), whereas the output of sample and hold circuit 58 will continually correspond with the output signal $V_o$ obtained when the current source is turned off (i.e., to $V_G$). A signal subtractor circuit 60 subtracts the output of sample and hold circuit 58 from the output of sample and hold circuit 56. The ground voltage is cancelled by the subtraction process, hence the output signal of the subtractor is representative of the voltage drop ($V_{SEN}$) across the sensor 10. The voltage $V_{SEN}$ is measured and displayed by a measurement and display circuit 62. Measurement and display circuit 62 may be similar to the measurement and display circuit 24 of FIG. 1.

FIG. 3 is a schematic illustration of a second, and presently preferred, embodiment of the present invention. In the FIG. 3 embodiment, the voltage $V_o$ at the output of the sensor 10 is converted into a sequence of digital words, and the digital words are then processed by a digital processing system. The embodiment includes a current source 100, an electrically controllable switch 102 for turning the current source on and off, a level shifter 104 for shifting the level of the sensor output signal, and a microprocessor controlled measurement, display, and control circuit 106. The current source 100 and electrically controllable switch 102 correspond to the current source 50 of FIG. 2, whereas the level shifter 104 and microprocessor circuit 106 perform the functions performed by the remainder of the circuitry shown in FIG. 2.

In a specific example shown in FIG. 3, the current source 100 is of a conventional form, including a PNP bipolar junction transistor 110, a current-sensing emitter resistor 112, and a current control circuit including an operational amplifier 114 and a resistive divider including resistors 116, 118. The junction transistor 110 is controlled by the output of operational amplifier 114. Operational amplifier 114 has its positive output connected to the junction between resistors 116 and 118, and its negative input connected to the junction between the current-sensing resistor 112 and the emitter of transistor 110. The operational amplifier 114 will increase or decrease the voltage applied to the base of transistor 110 such that the voltage drop across the resistor 112 is essentially the same as the voltage drop across the resistor 116. The voltage drop across resistor 116 is constant, hence the voltage drop across resistor 112 will also be held constant. Since the voltage drop across resistor 112 is constant, current flow through resistor 112 must also necessarily be constant. The magnitude of the current can be chosen by appropriate selection of the value of resistor 112.

Essentially all of the current through resistor 112 will pass through the collector-emitter current path of the transistor 110 and be applied to the sensor 10 through the connecting diode 120. The diode 120 is included to block current flow back into the current source 100 through the sensor 10 when the current source is switched off.

The electrically controlled switch 102 associated with the current source 100 includes a PNP switching transistor 130 having its collector-emitter current path connected in series between the $+V_s$ supply line and the power input terminal 132 to the current source. Transistor 130 is turned on and off by a transistor switching circuit including a transistor 134 and collector resistors 136 and 138. A control signal is applied to the base of the switching transistor 134 through a current-limiting base resistor 140.

If a high logic level signal is applied on the input 142 to the current source switch, the transistor 134 will turn on and base current will be drawn through the switching transistor 130. Transistor 130 will therefore turn on and saturate, causing virtually the entire supply voltage to be applied to the supply line 132 of the current source 100. The current source will then supply a substantially constant level of current to the sensor 10. If a low logic level signal is applied to the input 142 of switch 102, on the other hand, both of transistors 134 and 130 will be "off", whereby the supply line 132 of current source 100 will be essentially disconnected from the $+V_s$ supply line. Virtually no current will then flow through sensor 10. The current source 100 is thus controlled by the logic level of the signal applied upon the control line 142 of switch 102.

The voltage $V_o$ at the junction between the sensor 10 and the current source 100 will be positive as long as the current source 100 is turned on. When the current source is turned off, however, the voltage $V_o$ will merely be the ground shift voltage caused by circulating currents in the vehicle structure. The ground shift may be either positive or negative, hence the input signal $V_o$ may be negative in some cases. The microprocessor circuitry 106, however, cannot measure negative voltages. The level shifting circuit 104 is therefore included to insure that the input signal $V_{LS}$ applied to the microprocessor circuitry 106 is positive at all times, even though the sensor signal $V_o$ may, itself, be negative.

In FIG. 3, the level shifter 104 is shown as including an operational amplifier 150 connected in a conventional inverting amplifier arrangement. A feedback resistor 152 is connected between the output and inverting input of the operational amplifier 150, and an input resistor 164 is connected between the input of the level shifter and the inverting input of the amplifier. The feedback resistor 152 has a resistance value equal to the resistance value of the input resistor 164, whereby the amplifier has a gain of negative one. The non-inverting input of the amplifier 150 is connected to a resistive voltage divider 156 through an input resistor 158. The voltage $V_R$ developed by the resistive voltage divider will determine the output voltage of operational amplifier 150 when the sensor signal $V_o$ is zero. More specifically, the output signal $V_{LS}$ provided by the level shifter 104 will be equal to two $V_R$ minus $V_o$ ($V_{LS} = 2V_R - V_O$). $V_R$ will be selected such that the output signal $V_{LS}$ will be positive at all times.

The output of the level shifter 104 is applied to an analog-to-digital (A/D) converter 200 associated with the microprocessor circuit 106. The microprocessor controlled measurement and control circuit 106 generally includes a microprocessor 202, read-only memory (ROM) 204, random-access memory (RAM) 206, and three input/output (I/0) ports 208, 210 and 212, all interconnected by a system bus 214. The system bus 214 includes conventional address bus, data bus, and control bus portions. The analog-to-digital (A/D) converter 200 and a display circuit 220 are connected to the I/0 ports.

Microprocessor 202 controls the operation of the entire system shown in FIG. 3 in accordance with a program stored in the read-only memory 204. Generally, the microprocessor circuit 106 will be connected to various other elements of the system (not shown), and will provide measurement and/or control of the other elements and/or parameters of the system. For the purposes of the present discussion, however, only the microprocessor functions related to the sensor 10 are pertinent. FIG. 4 is a flow chart of the portion of the microprocessor program related to the measurement of the parameter to which the sensor 10 responds.

When the system is first turned on, the microprocessor performs to an initialization routine of conventional form. The initialization routine 1000 includes a step wherein the input/output port 210 is loaded with a digital word such that the input line 142 to switch 102 is at a low logic level. Current source 100 is therefore turned off.

In the next step 1002, the input/output port 210 is loaded with a word causing the A/D converter 200 to initiate conversion of the input signal $V_{LS}$ from level shifter 104 into a corresponding digital word. In the next step 1004, the microprocessor tests the "convert complete" output of A/D converter 200 to determine whether or not the conversion process has been completed. If the process has not been completed, the microprocessor merely repeats the step until such time as the process is finished. When the results of the test are positive, indicating that the conversion has been completed, the microprocessor proceeds on to step 1006.

In step 1006, the digital word D1 provided at the output of A/D converter 200 is read into the microprocessor 202 through an input port 208. The value D1 read from the A/D converter is then stored in RAM. The stored value D1 represents the voltage $V_o$ measured when no current is passing through the sensor 10, and hence represents the ground shift appearing at the ground connection of the sensor 10.

In the next step 1008, a high logic level signal is applied to the input of switch 102 through I/0 port 210. The high logic level signal causes current source 100 to turn on, whereby a known, fixed level of current $I_O$ is forced through the sensor 10. In step 1010, the microprocessor pauses for a preprogrammed interval of time necessary to permit the value of the voltage across the sensor 10 to stabilize. In step 1012, a "convert" command is applied to A/D converter 200 through I/0 port 210 whereby the A/D converter again begins conversion of the analog signal $V_{LS}$ into a digital value. The succeeding step 1014 is similar to step 1004, discussed above, in that the microprocessor repeatedly polls the A/D converter to find out whether the conversion process has been completed. In step 1016, the microprocessor reads the completed digital word D2 from the A/D convertor 200 through the input/output port 208. The value thus read is stored in RAM. The stored value D2 represents the sensor output voltage $V_o$ when the current source 100 is turned on.

In the next step 1018, the microprocessor causes a low logic level signal to be applied to the input switch 102 through input/output port 210, thereby causing the current source 100 to be turned off.

In step 1020, the corrected value P of the parameter is determined by subtracting the second measurement (D2) from the first measurement (D1). The offset ($2V_R$) and incidental signal inversion introduced by the level shifter 104 are also eliminated by the subtraction of D2 from D1. The result is thus a digital signal having a value P corresponding to the signal appearing across the sensor 10, unaffected by ground shifts.

In step 1022, the parameter value P calculated in step 1020 is loaded into the display circuit 220 through an I/0 port 212 to provide a visual display of the parameter value to the vehicle operator. The microprocessor then continues on to perform such other functions as are required of the microprocessor, before returning to step 1002 to repeat the measurement and display of the parameter to which the sensor 10 responds.

The FIG. 3 embodiment is essentially similar to the FIG. 2 embodiment, in the sense that each embodiment includes elements for causing the current source to first be turned on and then turned off, and elements to perform measurements during both the time that the current source is on and the time that the current source is off. The two measurements are then subtracted to produce a difference signal truely representative of the voltage drop across the sensor alone, unaffected by ground shifts.

Although the invention has been described with respect to a preferred embodiment, it will be appreciated that various rearrangements and alterations of parts may be made without departing from the spirit and scope of the present invention, as defined in the appended claims.

What is claimed is:

1. Apparatus comprising:
   a signal source;
   a variable impedance sensor having one end connected to an electrically conductive member and its other end connected to said signal source;
   switch means for selectively turning said signal source on and off;
   measuring means having a first terminal connected to said other end of said sensor and a second terminal connected to a point on said electrically conductive member different than the point to which said sensor is connected, said measuring means including first means for providing a first signal indicative of the voltage developed across said sensor when said signal source is on, second means for providing a second signal indicative of the voltage developed across said sensor when said signal source is off, said measuring means providing an output signal indicative of the difference between said first signal and second signal.

2. Apparatus as set forth in claim 1, wherein said variable impedance sensor comprises a sensor having a resistance which varies as a function of a physical parameter.

3. Apparatus as set forth in claim 2, wherein said signal source comprises a source providing a substantially constant current through said sensor.

4. Apparatus as set forth in claim 3, wherein said measuring means comprises digital processing means programmed to
   cause said switch means to cyclically turn said current source on and off,
   measure the voltage across said first and second terminals when said current source is on,
   measure the voltage across said first and second terminals when said current source is off,
   subtract the first and second measured voltages to provide a difference signal, and provide an output signal related to said difference signal.

5. Apparatus as set forth in claim 1, wherein said measuring means includes means for converting the signal across said first and second terminals into a sequence of digital words, and digital processing means for processing said sequence of digital words to determine said difference.

6. Apparatus as set forth in claim 1, wherein said sensor comprises a sensor for sensing the value of a parameter related to the operation of a motor vehicle, and wherein said electrically conductive member comprises part of the engine or chassis of said vehicle.

7. Apparatus as set forth in claim 3 wherein said measuring means includes:
   clock means for causing said switch means to cyclically switch said current source on and off; and
   signal subtractor means for subtracting said first and second signals to provide said output signal.

8. A method of measuring a parameter with a variable impedance, parameter-sensitive element having first and second terminals, comprising the steps of:

connecting said first terminal of said variable impedance, parameter-sensitive element to a structural grounding element,
connecting said second terminal of said variable impedance element to signal-applying and voltage-measuring elements,
applying a known signal to said second terminal of said element,
measuring the resulting signal at said second terminal of said element,
turning off said applied signal,
measuring the resulting signal at said second terminal of said element, and
using the second measured signal to correct the first measured signal for stray signals on said grounding element so as to thereby provide an output signal correctly representative of the impedance of said element.

9. A method as set forth in claim 8, wherein said parameter sensitive element has a resistance which changes as a function of said parameter, and wherein said step of applying a known signal to said second terminal comprises the step of applying a substantially constant level of current to said element through said second terminal.

10. Apparatus comprising:
a current source;
a variable impedance sensor having one end connected to an electrically conductive member and its other end connected to said current source;
switch means for selectively turning said current source on and off;
measuring means having a first terminal connected to said other end of said sensor and a second terminal connected to a point on said electrically conductive member different than the point to which said sensor is connected, said measuring means including first means for providing a first signal indicative of the voltage developed across said sensor when said current source is on, second means for providing a second signal indicative of the voltage developed across said sensor when said current source is off, said measuring means providing an output signal indicative of the difference between said first signal and second signal.

* * * * *